United States Patent [19]
Emshoff et al.

[11] Patent Number: 5,701,044
[45] Date of Patent: Dec. 23, 1997

[54] PROCESS AND DEVICE FOR MONITORING THE TEMPERATURE OF AN ELECTRIC GENERATOR

[75] Inventors: Horst-Werner Emshoff; Lutz Intichar, both of Mülheim an der Ruhr; Hermann Scheil, Hemhofen, all of Germany

[73] Assignee: Siemens Aktiengesellschaft, Munich, Germany

[21] Appl. No.: 599,385

[22] Filed: Feb. 9, 1996

Related U.S. Application Data

[63] Continuation of PCT/DE94/00863, Jul. 26, 1994.

[30] Foreign Application Priority Data

Aug. 9, 1993 [DE] Germany .................. 43 26 680.0

[51] Int. Cl.[6] .................................................. H02K 11/00
[52] U.S. Cl. .................. 310/54; 310/53; 310/68 C; 374/152; 364/557; 364/573.03; 364/573.04
[58] Field of Search ................. 310/53, 54, 68 C; 374/152; 340/870.17, 870.05; 364/557, 571.01, 571.02, 571.03, 571.04, 571.05; 322/33, 99

[56] References Cited

U.S. PATENT DOCUMENTS

| | | | |
|---|---|---|---|
| 3,843,872 | 10/1974 | Shimomura | 235/92 |
| 4,291,355 | 9/1981 | Dinger | 364/480 |
| 4,547,826 | 10/1985 | Premerlani | 364/483 |
| 4,602,872 | 7/1986 | Emery et al. | |
| 4,823,290 | 4/1989 | Fasack et al. | 364/557 |
| 5,097,669 | 3/1992 | Hargrove et al. | 310/53 |

FOREIGN PATENT DOCUMENTS

| | | |
|---|---|---|
| 0 209 364 | 1/1987 | European Pat. Off. . |
| 0 192 373 | 11/1987 | European Pat. Off. . |
| 35 35 550 | 4/1986 | Germany . |

Primary Examiner—Thomas M. Dougherty
Assistant Examiner—B. Mullins
Attorney, Agent, or Firm—Herbert L. Lerner; Laurence A. Greenberg

[57] ABSTRACT

In order to monitor the temperature of an electric generator, the temperatures of a plurality of rods of a stator winding of the generator being cooled by a coolant, preferably a water-cooled stator winding, are detected. In order to detect a temperature deviation in each winding rod, a measured actual or real temperature value of each winding rod is compared with a reference value for the winding rod. The reference value is derived from parameters previously determined for the winding rod by reference measurement and from presently or currently detected, operation-relevant parameters of the generator. The parameters for each winding rod are derived from a temperature of the winding rod detected during the reference measurement and from a number of functions that corresponds to the number of parameters. The functions are derived from operation-relevant parameters detected during the reference measurement in different states of operation of the generator. The temperature may thus be monitored while operation-relevant influencing variables, such as the stator current of the generator, are taken into account.

10 Claims, 1 Drawing Sheet

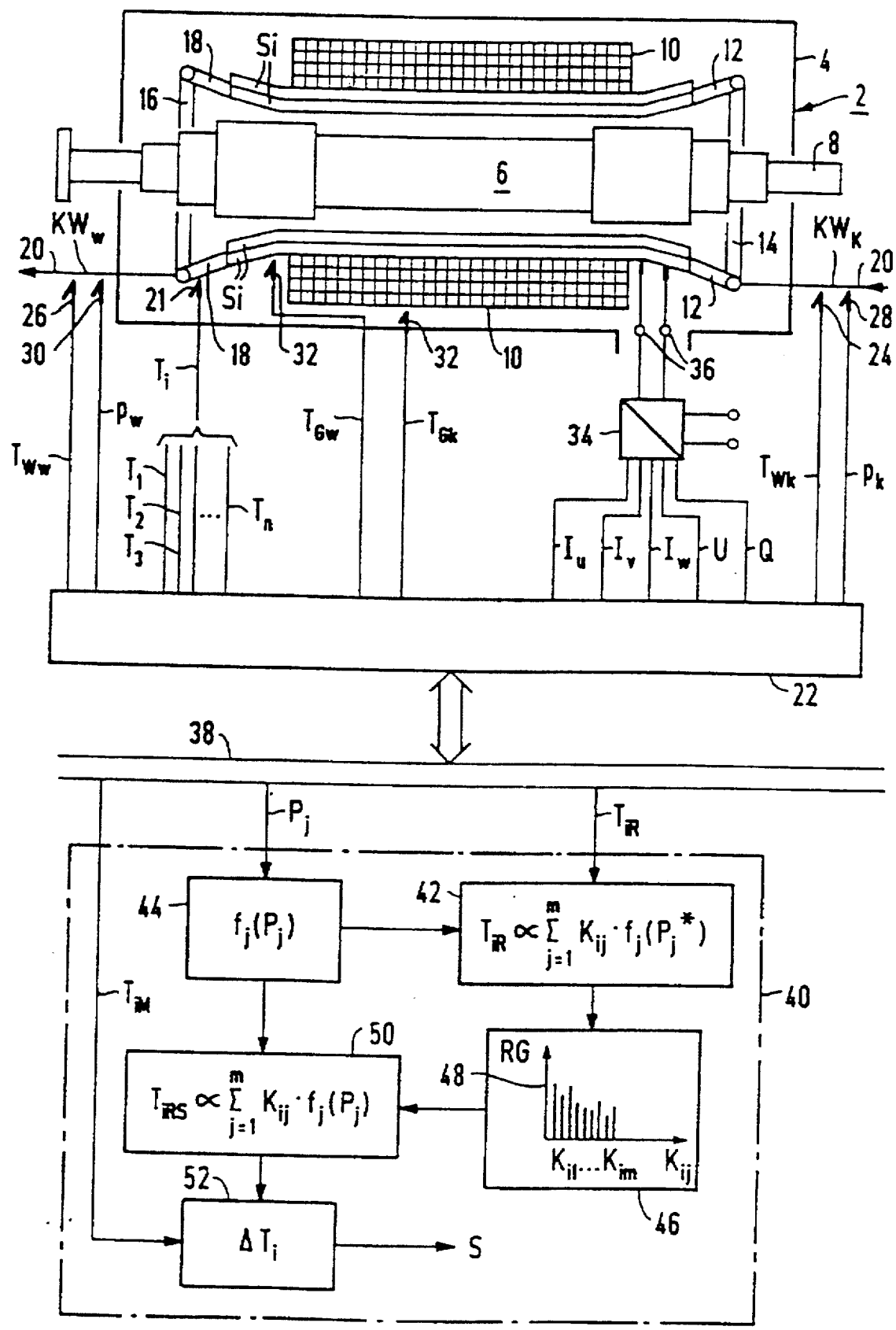

PROCESS AND DEVICE FOR MONITORING THE TEMPERATURE OF AN ELECTRIC GENERATOR

CROSS-REFERENCE TO RELATED APPLICATION

This application is a Continuation of International Application PCT/DE94/00863, filed Jul. 26, 1994.

BACKGROUND OF THE INVENTION

Field of the Invention

The invention relates to a process for monitoring the temperature of an electric generator, in which the temperatures of a plurality of winding rods of a stator winding of the generator being cooled by a coolant, preferably a stator winding being cooled by water, are detected.

The invention also relates to a device for monitoring the temperature of an electric generator, having a stator winding being cooled with a coolant, preferably a stator winding being cooled by water, and having a plurality of winding rods, including a first component for detecting and processing a measured temperature value for each winding rod.

One such process and one such device are known from German Published, Non-Prosecuted Patent Application DE 35 35 550 A1, corresponding to U.S. Pat. No. 4,733,225 as well as Published European Patent Application 0 192 373 A3, corresponding to U.S. Pat. No. 4,602,872.

In individual hollow conductors of winding rods of water-cooled generator windings, in which water flows though the conductors, partial conductor breakages or plugging up of partial conductors can occur. The consequence is severe local heating (hot-point temperature) that threatens insulation. Since no statement about individual courses in winding rods can be made from a simple measurement of the total water heating, a temperature sensor must be disposed on the warm-water side of each winding rod. However, even a rise in the water heating of an individual winding rod caused by a flow disruption, in which the initial volumetric flow becomes less and thus the heating becomes greater, is still slight in comparison with the change in a local heating. For instance, plugging up of 10% of the number of hollow conductors in a winding rod can cause only a slight rise in water heating of from 3 to 4K, although if the stopped-up hollow conductors are unfavorably located, for instance if a plurality of hollow conductors located directly next to one another are stopped up, the allowable heating of the insulation will already be locally exceeded.

While an allowable temperature band is defined in the monitoring system known from German Published, Non-Prosecuted Patent Application DE 35 35 550 A1, corresponding to U.S. Pat. No. 4,733,225, by the fact that a maximum allowable temperature value and a minimum allowable temperature value are each defined by a second degree polynomial, in the monitoring system known from Published European Patent Application 0 192 373 A3, corresponding to U.S. Pat. No. 4,602,872, a standardized averaged temperature and a correction influencing variable for each winding rod, are initially ascertained from a reference measurement. In a current or present monitoring, even a slight rise in temperature of an individual winding rod then leads to a relatively major deviation from a currently or presently ascertained average temperature which is referred to the standardized average temperature. However, in that monitoring system, operationally dictated influencing variables that influence the coolant temperature are taken into account solely in the reference measurement.

SUMMARY OF THE INVENTION

It is accordingly an object of the invention to provide a process and a device for monitoring the temperature of an electric generator, which overcome the hereinafore-mentioned disadvantages of the heretofore-known processes and devices of this general type and which take operation-dictated influencing variables into account in an especially simple manner.

With the foregoing and other objects in view there is provided, in accordance with the invention, a process for monitoring the temperature of an electric generator, which comprises detecting temperatures of a plurality of winding rods of a stator winding of a generator being cooled by a coolant, preferably a water-cooled stator winding; ascertaining a temperature deviation for each winding rod by comparing a measured actual value of the temperature of the winding rod with a reference value for the winding rod; forming the reference value from characteristic variables ascertained previously for the winding rod from a reference measurement and from currently detected operation-relevant parameters of the generator; ascertaining the characteristic variables for each winding rod from a temperature of the winding rod detected in the reference measurement and from a number of functions being identical to a number of characteristic variables, the functions being dependent on the operation-relevant parameters and operation-relevant parameters detected at different operating states of the generator being evaluated therefor in the reference measurement; and both the currently detected operation-relevant parameters and the operation-relevant parameters detected in the reference measurement each including a stator current of the generator as well as at least one of the following parameters: a terminal voltage of the generator, a reactive output, a temperature of the coolant before and after passage through the winding rods, and a temperature of a generator coolant, especially hydrogen, contained in the generator.

The invention is based on the recognition that the coolant temperature or the coolant heating and thus the heating of the winding rods depend not only on flow disruptions in individual winding rods but also on operation-relevant parameters of the generator. The operation-relevant parameters are those physical variables (influencing variables) that influence the heating of the winding rods, such as the generator voltage, the generator current, and/or the reactive power output.

The functions of each parameter are determined from a number of load points, preferably more than three different load points, to which the generator is driven or adjusted for the reference measurement. The characteristic variables are suitably the coefficients of a polynomial formed for each winding rod, having functions which represent the course of the operation-relevant parameters as a function of the load or of operating states of the generator. The operation-dictated influencing variables are thus taken into account through the use of the functions.

In accordance with another mode of the invention, in a current or present monitoring, the reference value for each winding rod is suitably likewise calculated from a polynomial formed for that winding rod. The polynomial is formed from function values of the parameters being presently or currently detected for an arbitrary operating state, and the characteristic variables derived from the reference measurement are used as coefficients.

In accordance with a further mode of the invention, as further operation-relevant parameters, which are detected both in the reference measurement and currently or presently, it is expedient to detect, in addition to the stator current or stator currents of the generator, the terminal voltage of the generator, the reactive power (reactive power output of the generator), the temperature of the coolant before and after passage through the winding rods, and the temperature of a coolant, such as hydrogen, contained in the generator, and one or more of the following variables are also detected: the coolant volumetric flow or the difference between the pressure of the coolant before and the pressure of the coolant after passage through the winding rods. Detecting the plurality of measured temperature values of the winding rods both in the reference measurement and in a present or current monitoring requires a not inconsiderable period of measurement time. For instance, up to 216 measured temperature values must be detected for a corresponding number of winding rods. Within this period of measurement time, the generator should be in a state of so-called thermal persistence, in which the operation-relevant parameters or influencing variables must remain virtually constant and can be allowed to fluctuate only within a predeterminable tolerance range. The operation-relevant parameters used to form the reference values are therefore preferably measured periodically within an adjustable measurement cycle in a present or current operating state. Each measured value of a parameter is compared with the value of a previous period of the measuring cycle, in order to ascertain any deviation. A thermal persistence is attained whenever at the end of the measuring cycle, for each parameter, no deviations or deviations located only within the tolerance range are found between the measured values of this parameter.

With the objects of the invention in view, there is also provided a device for monitoring the temperature of an electric generator having a stator winding being cooled with a coolant, preferably with water, and having a plurality of winding rods, comprising a first component for detecting and processing a measured temperature value for each of a plurality of winding rods of an electric generator; a data bus; and a second component being connected through the data bus to the first component for ascertaining a temperature deviation of a measured rod-specific actual value of a rod-specific reference value for each winding rod, the second component having a first computer unit for calculating characteristic variables formed from a reference measurement and a second computer unit for calculating the rod-specific reference values from the characteristic variables and from currently detected operation-relevant parameters; the first component detecting a stator current and at least one of the following parameters as current operation-relevant parameters: a terminal voltage of the generator, a reactive output, a temperature of the coolant before and after passage through the winding rods, and a temperature of a generator coolant, preferably hydrogen, contained in the generator.

In accordance with a concomitant feature of the invention, the second component includes a memory for storing the rod-specific characteristic variables.

The advantages attained with the invention are in particular that a precise and at least virtually continuous monitoring of the temperature of the winding rods of the generator is possible through the use of an evaluation process with the aid of polynomials, taking operation-relevant parameters or operation-dictated influencing variables into account.

Other features which are considered as characteristic for the invention are set forth in the appended claims.

Although the invention is illustrated and described herein as embodied in a process and a device for monitoring the temperature of an electric generator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE of the drawing is a function diagram with components provided for performing a monitoring process according to an exemplary embodiment of the invention.

DESCRIPTION OF THE PREFERRED EMBODIMENTS

Referring now to the single FIGURE of the drawing in detail, there is seen a diagrammatic, longitudinal-sectional view of a generator 2 to be monitored that includes a rotor 6 on a shaft 8 and a stator winding 10, all of which are disposed in a generator housing 4. Winding bars or rods $S_i$ of the water-cooled stator winding 10, only some of which have been singled out to be shown in the drawing, are connected electrically in series in order to form the stator winding 10. Coolant KW flows through each winding rod $S_i$, that is through a number of non-illustrated partial conductors of each winding rod $S_i$. To that end, the winding rods $S_i$ communicate on the inflow side through insulating plastic hoses 12 with a common ring line 14, into which cold coolant $KW_k$ flows. Coolant $KW_w$ that is warmed in the winding rods $S_i$ is collected on the outflow side in a further ring line 16, which likewise communicates with the individual winding rods $S_i$ through plastic hoses 18. The warm coolant $KW_w$ is returned to a coolant loop 20 which is represented by arrows, and is recooled there in a non-illustrated manner.

A temperature $T_i$ of each winding rod $S_i$ is detected on the outflow side. To that end, the temperature $T_i$ of the warmed coolant water $KW_w$ flowing out of the respective winding rod $S_i$ is measured through the use of a number of temperature sensors 21 corresponding to the number of winding rods $S_i$, only one of which sensors is schematically shown for the sake of simplicity. Thermocouples or resistance thermometers are provided as the temperature sensors 21 for up to 216 winding rods $S_i$ that are present. Measured temperatures $T_i=T_1, \ldots, T_n$ of the n winding rods $S_i$ are supplied to a measurement value detecting and processing component 22. The component 22 is supplied with further measured values in the form of a temperature $T_{Wk}$ of the cold coolant $KW_k$ which is measured on the inflow side of the winding rods $S_i$ through the use of a temperature sensor 24; a temperature TWw which is measured through the use of a temperature sensor 26 for the warmed coolant $KW_w$ flowing out of all of the winding rods $S_i$ to the ring line 16; pressures $P_k$ and $P_w$ which are measured through the use of pressure sensors 28, 30 for the cold coolant $KW_k$ on the inflow side and the warmed coolant $KW_w$ on the outflow side of the respective winding rods $S_i$; and temperatures $T_{Gk}$ and $T_{Gw}$ which are measured at various points inside the generator housing 4 by temperature sensors 32 measuring an additional coolant gas, such as hydrogen, that cools the generator 2. The temperatures $T_{Gk}$ and $T_{Gw}$ are the respective temperatures of the cool and the warmed coolant gas.

The component 22 is also supplied with further measurement signals or measured values in the form of values of three stator phase currents $I_u$, $I_v$ and $I_w$, a generator terminal voltage U, and a reactive power Q, which are filtered through isolation amplifiers 34 out of existing non-illustrated measurement circuits that communicate with connection terminals 36 of the stator winding 10. These measured values $I_u$, $I_v$, $I_w$, U, Q, the temperatures $T_{Wk}$, TWw and the pressure pk, pw of the coolant KW and the temperatures $T_{Gk}$, $T_{Gw}$ of the coolant gas form m operation-relevant parameters $P_j = P_1, \ldots, P_m$.

The component 22 serves to monitor the limit value or control plausibility and also serves the purpose of analog/digital conversion of the measured values of the rod temperatures $T_i$ and the parameters $P_j$. It also serves to build up data telegrams and to form signals for warnings and malfunctions.

The component 22 communicates through a data bus 38 with a further component 40 for monitoring the temperatures $T_i$ of the winding rods $S_i$. This further component includes a first computer unit 42 for calculating rod-specific characteristic variables $K_{ij}$. These variables are derived from a reference measurement for each of the I=1, . . . , n winding rods $S_i$ through the use of a polynomial of the form $$T_{iR} = a \sum_{j=1}^{m} k_{ij} \cdot f_j (P^*_j).$$

In the polynomial, $T_{iR}$ is the temperature, which is detected upon the measurement, of the $i^{th}$ winding rod $S_i$, and $f_j (P^*_j)$ is m functions of the j=1, . . . , m operation-relevant parameters $P^*_j$. The functions $f_j$ of the influencing variables or parameters $P_j$ are derived from empirical values and defined on the basis of technical relationships, where m=6 functions, for instance, $f_1=1$, $f_2=I^2$, $f_3=I^2 \cdot TWw$, $f_4=U^2$, $f_5=T_{Wk}-T_{Gk}$, and $f_6=Q$. The positions of the functions $f_j$ in the polynomial can also be transposed, such as if a technical relationship can be made more precise by stating that $f_2=U^2$ and $f_4=I^2$. In the factor a, the volumetric flow V of the coolant KW or the differential pressure $\Delta p = p_w - p_k$ of the coolant KW, standardized to the highest operating pressure, through the stator winding 10, respectively, is taken into account, for which $a=(1/V)^b$ and $a=(\Delta p_{standardized}/\Delta p^c)$, respectively. In these equations, $b^{31} < 2^-$ and c<3, for instance b=c=½. The polynomial for the $i^{th}$ winding rod $S_i$ is thus proportional to the temperature $T_{iR}$ detected for this rod in the reference measurement. In other words, $$T_{iR} \propto \sum_{j=1}^{m} k_{ij} \cdot f_j (P^*_j).$$

In the reference measurement, the function courses of the individual operation-relevant parameters $P^*_j$ for different operating or load states are picked up from the "healthy generator". In other words, this is done on the understanding that a malfunction-free or error-free operation of the generator, such as prior to its being placed into service, prevails. The ascertainment of the function courses in carried out in a computer unit 44. The coefficients $K_{ij}$ of the polynomial, which represent the respective m characteristic variables of the n winding rods $S_i$ and are ascertained in the computer unit 42 from these functions $f_j (P^*_j)$ and from the temperatures $T_{iR}$ of the winding rods $S_i$, are stored in a memory 46. The characteristic variables $k_{ij}$ and their relative magnitudes RG are illustrated in a bar diagram 48.

In a present or current monitoring, for an arbitrary operating state of the generator 2, the operation-relevant parameters $P_j$ are first measured within an adjustable measurement cycle, for instance within a period of from 3 to 15 minutes. The length of the period of time depends substantially on the time constants of the temperature sensors 21. If these measured values of the parameters $P_j$ are constant within this measurement cycle, or are within a predeterminable tolerance range, then the generator 2 has reached a status of thermal persistence. In the case of each parameter $P_j$, the periodically written-in measured values are compared with those of a previous period of the measurement cycle. If no deviation is found or if the deviations are within the tolerance range, thermal persistence exists. At the end of the measurement cycle, the temperatures $T_i$ of the n winding rods $S_i$ are written in. After the writing in of the temperature $T_i$, the measured values of the parameters $P_j$ are memorized once again and checked. If the measurement values of the parameters $P_j$ continue to be constant, then they are made the basis of a so-called static assessment. Conversely, if deviations are found in one or more of the operation-relevant parameters $P_j$, then the most recently detected measured values can be made the basis of a so-called dynamic assessment. Both in the static assessment and the dynamic assessment, the corresponding function values $f_j (P_j)$ are formed from the measured values of the present parameters $P_j$ in the computer unit 44. In a further computer unit 50, a reference value $T_{iRS}$ is ascertained from these function values $f_j (P_j)$ for each winding rod $S_i$. To that end, the reference value $T_{iRS}$ of the $i^{th}$ winding rod $S_i$ is calculated from a polynomial of the following form $$T_{iRS} = a \sum_{j=1}^{m} k_{ij} \cdot f_j (P_j),$$

in which the function values $f_j (P_j)$ of the presently ascertained parameters $P_j$ and the coefficients $k_{ij}$ ascertained from the reference measurement are used from the memory 46. The reference value $T_{iRS}$ of the $i^{th}$ winding rod $S_i$ is thus proportional to the polynomial formed from the coefficients $k_{ij}$ stored in memory and from an arbitrary data set of function values $f_j (P_j)$.

In order to ascertain a temperature deviation $\Delta T_i$, the reference value $T_{iRS}$ of the $i^{th}$ winding rod $S_i$ ascertained in the computer unit 50 is compared in a comparison stage 52 with the presently measured real or actual value of the temperature $T_{iM}$ of the $i^{th}$ winding rod $S_i$. If the measured real or actual value $T_{iM}$ deviates from the reference value $T_{iRS}$, and if this deviation $\Delta T_i$ is outside a predeterminable tolerance range, then a report or a signal S is generated, which is output to a control panel in a non-illustrated manner. A change in warming $\Delta(\Delta T_i)$ of the corresponding winding rod $S_i$ can also be ascertained from a change over time of a temperature deviation $\Delta T_i$ or from a deviation compared with a prior value $\Delta T_i$.

Through the use of this process, in which monitoring of the temperature of each winding rod $S_i$ is carried out while taking the operation-relevant parameters $P_j$ or operation-dictated influencing variables into account, conclusions can be drawn for each winding rod $S_i$ about the cause of the deviation or change, from an ascertained temperature deviation $\Delta T_i$ or a change in warming $\Delta(\Delta T_i)$.

We claim:

1. A process for monitoring the temperature of an electric generator, which comprises:

detecting temperatures of a plurality of winding bars of a stator winding of a generator being cooled by a coolant;

ascertaining a temperature deviation for each winding bar by comparing a measured actual value of the temperature of the winding bar with a reference temperature value for the winding bar;

determining characteristic variables for the winding bar from a reference measurement;

forming the reference value from currently detected operation-relevant parameters of the generator and from the characteristic variables;

ascertaining the characteristic variables for each winding bar from a temperature of the winding bar detected in the reference measurement and from a number of functions identical to a number of characteristic variables, the functions being dependent on the operation-relevant parameters and operation-relevant parameters detected at different operating states of the generator being evaluated therefor in the reference measurement; and both the currently detected operation-relevant parameters and the operation-relevant parameters detected in the reference measurement each including a stator current of the generator as well as at least one of the following parameters: a terminal voltage of the generator, a reactive output, a temperature of the coolant before and after passage through the winding bars, and a temperature of a generator coolant contained in the generator.

2. The process according to claim 1, which comprises detecting the temperatures of the winding bars of a water-cooled stator winding.

3. The process according to claim 1, which comprises including the temperature of hydrogen as the generator coolant in the parameters.

4. The process according to claim 1, which comprises ascertaining the characteristic variables of an $i^{th}$ winding bar by forming a polynomial of the following form:

$$T_{iR} \propto \sum_{j=1}^{m} k_{ij} \cdot f_j (P^*_j)$$

in which $f_j (P^*_j)$ are m functions $(f_j)$ being evaluated for the parameters $(P^*_j)$ detected in the reference measurement, $k_{ij}$ are m coefficients representing the corresponding characteristic variables, and $T_{iR}$ is the temperature of the $i^{th}$ winding bar being detected in the reference measurement.

5. The process according to claim 1, which comprises ascertaining the reference value from a polynomial of the following form:

$$T_{iRS} \propto \sum_{j=1}^{m} k_{ij} \cdot f_j (P^*_j)$$

in which $f_j (P_j)$ are function values of parameters $(P_j)$ measured in an arbitrary operating state, $k_{ij}$ are m coefficients representing the characteristic variables, and $T_{iRS}$ is the reference value of the temperature of the $i^{th}$ winding bar being ascertained therefrom.

6. The process according to claim 1, which comprises periodically measuring the operation-relevant parameters serving to form the reference value in a current operating state within an adjustable measurement cycle, and comparing each measured value of a parameter for ascertaining a deviation from a value of a previous period of the measuring cycle.

7. A device for monitoring the temperature of an electric generator having a stator winding being cooled with a coolant and having a plurality of winding bars, comprising:

a first component for detecting and processing a measured temperature value for each of a plurality of winding bars of an electric generator;

a data bus; and a second component being connected through said data bus to said first component for ascertaining a temperature deviation of a measured bar-specific actual temperature value from a bar-specific reference temperature value for each winding bar, said second component having a first computer unit for calculating characteristic variables formed from a reference measurement, and a second computer unit for calculating the bar-specific reference values from the characteristic variables and from currently detected operation-relevant parameters;

said first component detecting a stator current and at least one of the following parameters as current operation-relevant parameters: a terminal voltage of the generator, a reactive output, a temperature of the coolant before and after passage through the winding bars, and a temperature of a generator coolant contained in the generator.

8. The device according to claim 7, wherein the stator winding is water-cooled.

9. The device according to claim 7, wherein hydrogen is the generator coolant.

10. The device according to claim 7, wherein said second component includes a memory for storing the characteristic variables.

* * * * *